United States Patent
Ayotte et al.

(10) Patent No.: US 10,050,012 B2
(45) Date of Patent: Aug. 14, 2018

(54) METHOD FOR SEMICONDUCTOR DIE REMOVAL REWORK

(71) Applicant: International Business Machines Corporation, Armonk, NY (US)

(72) Inventors: Stephen P. Ayotte, Bristol, VT (US); Glen E. Richard, Burlington, VT (US); Timothy M. Sullivan, Essex, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 268 days.

(21) Appl. No.: 14/951,935

(22) Filed: Nov. 25, 2015

(65) Prior Publication Data

US 2017/0148762 A1 May 25, 2017

(51) Int. Cl.
*B23K 1/002* (2006.01)
*H01L 23/00* (2006.01)
*B23K 1/018* (2006.01)
*B23K 3/02* (2006.01)

(52) U.S. Cl.
CPC .............. *H01L 24/98* (2013.01); *B23K 1/002* (2013.01); *B23K 1/018* (2013.01); *B23K 3/029* (2013.01); *H01L 24/799* (2013.01); *H01L 2224/75251* (2013.01); *H01L 2224/75315* (2013.01); *H01L 2224/75745* (2013.01)

(58) Field of Classification Search
CPC .... H01R 43/00; H01R 43/02; H01R 43/0256; B23K 1/002; B23K 1/018; B23K 3/029; H01L 24/98; H01L 24/799; H01L 2224/75251; H01L 2224/75315; H01L 2224/75745
See application file for complete search history.

(56) References Cited

U.S. PATENT DOCUMENTS

| | | |
|---|---|---|
| 4,066,204 A | 1/1978 | Wirbser et al. |
| 5,605,277 A | 2/1997 | Jackson et al. |
| 5,890,646 A | 4/1999 | Tang et al. |
| 6,121,118 A | 9/2000 | Jin et al. |
| 6,135,522 A | 10/2000 | Su et al. |
| 6,145,901 A | 11/2000 | Rich |
| 6,182,884 B1 | 2/2001 | Ma et al. |

(Continued)

FOREIGN PATENT DOCUMENTS

KR 100517010 B1 9/2005

OTHER PUBLICATIONS

Empfasis, [online]; [retrieved on Nov. 20, 2015]; http://www.empf.org/empfasis/2010/Apr10/tech_tips_410.html. "Tech Tips: Flip Chip Rework", Apr. 2010.

(Continued)

*Primary Examiner* — Carl Arbes
(74) *Attorney, Agent, or Firm* — Cantor Colburn LLP; Jennifer Anda

(57) ABSTRACT

Disclosed are processes and apparatuses for semiconductor die removal and rework, including thin dies. In one aspect the process involves the use of a localized induction heating system to melt targeted solder joints, thereby minimizing the degradation of the thermal performance of the assembly undergoing the rework. Use of a vacuum-based die removal head, optionally in combination with the induction heating system, allows for the removal of thin dies of 150 micrometers thick or less.

13 Claims, 3 Drawing Sheets

(56) References Cited

U.S. PATENT DOCUMENTS

| | | | |
|---|---|---|---|
| 6,727,162 | B2 | 4/2004 | Holzapfel et al. |
| 7,033,910 | B2* | 4/2006 | Faris ................... B81C 1/00119 |
| | | | 257/E21.525 |
| 7,064,004 | B2 | 6/2006 | Frutschy |
| 8,852,391 | B2* | 10/2014 | McCutcheon ........ H01L 21/187 |
| | | | 156/714 |
| 9,099,512 | B2* | 8/2015 | Flaim .................. H01L 21/6835 |
| 9,263,314 | B2* | 2/2016 | Puligadda ........... H01L 21/2007 |
| 2004/0217003 | A1* | 11/2004 | Haba ........................ H01L 23/32 |
| | | | 204/471 |
| 2011/0247872 | A1* | 10/2011 | Ma ....................... B23K 1/0016 |
| | | | 174/263 |
| 2012/0034437 | A1* | 2/2012 | Puligadda ........... H01L 21/2007 |
| | | | 428/212 |
| 2013/0139380 | A1 | 6/2013 | Lee et al. |
| 2015/0089805 | A1 | 4/2015 | Ayotte et al. |

OTHER PUBLICATIONS

Indium Corporation, [online]; [retrieved on Nov. 19, 2015]; http://www.indium.com/blog/effect-of-package-and-die-size-on-dipping-and-pick-up.php#sthash.jD9x3k91.dpuf. Mackie, A., "Effect of Package and Die Size on Dipping and Pick-up".

M. Pecht et al. (Eds.) "Quality Conformance and Qualification of Microelectronic Packages and Interconnects", pp. 413, John Wiley & Sons, Inc., New York, N.Y. ( 1 page).

Mahahan, S. and L.C. Kimerling (Eds.) "Concise Encyclopedia of Semiconducting Materials & Related Technologies", 1992, pp. 186, Pergamon Press, Tarrytown, N.Y. ( 1 page).

Semiconductor Equipment Corp., [online]; [retrieved Nov. 20, 2015]; http://www.semicorp.com/articles/published-articles/item/reworking-underfilled-flip-chips. Moore, D. "Reworking Underfilled Flip Chips", Mar. 26, 2014 (7 pages).

* cited by examiner

METHOD FOR SEMICONDUCTOR DIE REMOVAL REWORK

BACKGROUND

The present invention generally relates to a method and structure of semiconductor die removal and rework, specifically for dies having thicknesses of 150 micrometer and below, and to minimize the degradation of the thermal performance of a chip assembly undergoing the rework.

Previous semiconductor manufacturing processes of a wafer with multiple functional dies employ controlled chip collapse connection "C4" or "flip chip" technology to connect the semiconductor dies onto the substrate module. During rework, the semiconductors dies having 700-800 micrometer thicknesses can be removed by a mechanical rework process. This process involves placing the substrate in an upside down orientation, mechanically attaching a weighted device to the edge of the die to be removed, heating the solder joint to liquidus, and allowing the force of gravity to remove the die. Since the solder joint is liquid, there is a high surface tension between substrate and die that needs to be overcome to remove the die.

SUMMARY

In one embodiment, a method comprises providing an assembly comprising a substrate and a die attached to the substrate through a solder joint, the die having a thickness of 150 micrometers or less; connecting a die removal head to the die, the die removal head comprising a connecting means to connect the die removal head to the die; heating the solder joint to liquidus using inductive heating; and separating the die from the substrate.

In another embodiment, a method comprises providing an assembly comprising a substrate and a die attached to the substrate through a solder joint, the die having a thickness of 150 micrometers or less; connecting a die removal head to the die, the die removal head comprising a connecting means to connect the die removal head to the die; heating the solder joint to liquidus; and separating the die from the substrate, wherein the die removal head is attached to a spring to provide spring-assisted die removal.

In yet another embodiment, an apparatus, comprises an induction heating system comprising an induction coil electrically connected to an alternating current source; and a die removal head comprising a connecting means; wherein the apparatus separates a die attached to a substrate through a solder joint.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
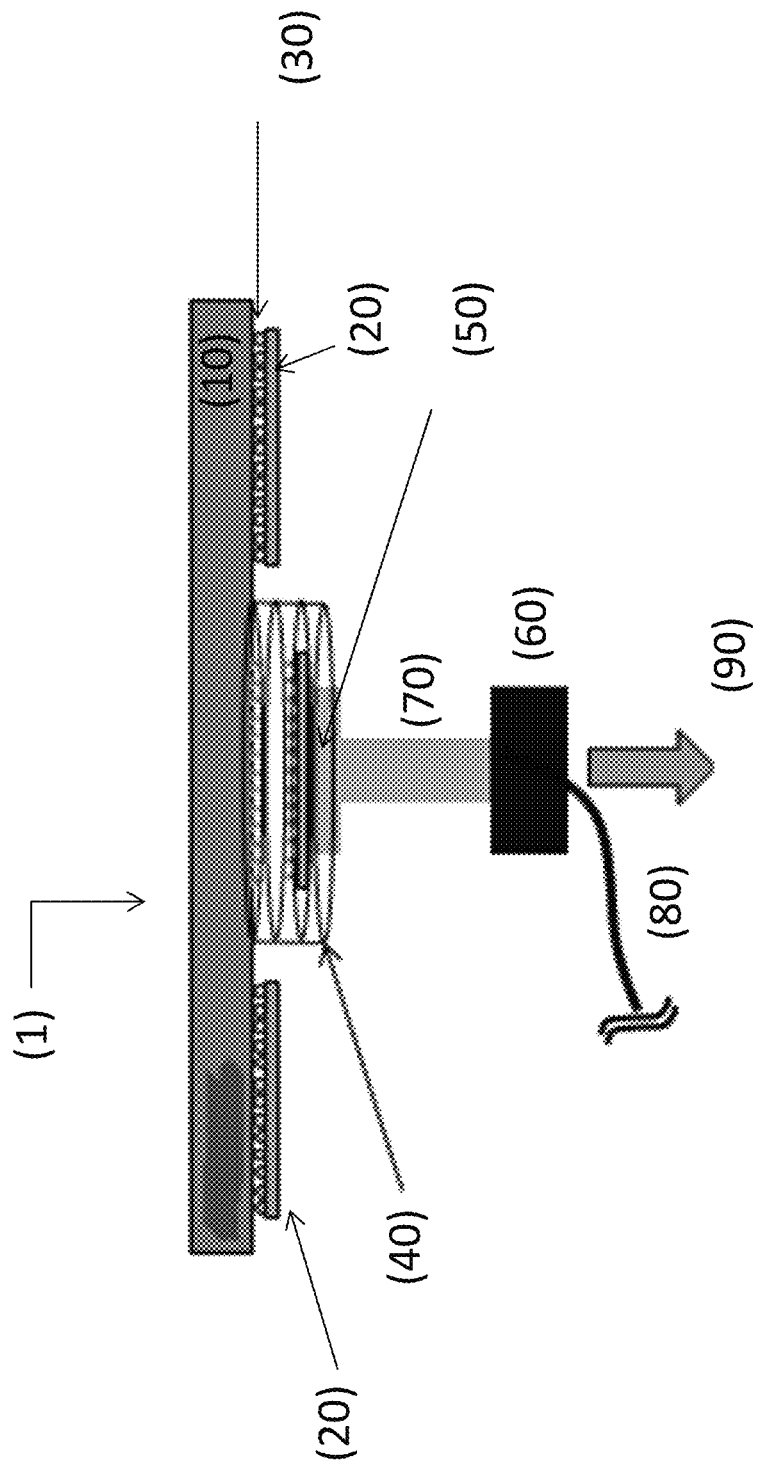
FIG. 1 is a schematic of a gravity-assisted die removal apparatus and process using inductive heating and a vacuum attached die removal head.

As stated above, the present invention relates to a method and structure of die removal and rework, and specifically to thin die (150 micrometers or less) removal and rework. There are several reasons to conduct die removal and rework, including poor solder connection integrity and/or a defective die. The solder connection integrity, such as a C4 connection integrity, can be determined by sight check or by X-ray analysis. A defective die can be determined by conducting an electrical test for the both the connector and the die.

Currently there is no known method to remove a thin die, i.e. 150 micrometers or less, from a substrate post chip join using C4. Due to the fragility of the thin die it is not possible to mechanically join to the edge of the die using conventional technology.

Furthermore, conventional rework processes often involve heating the entire structure (substrate, dies, etc.) in an oven thereby creating a heat history to all the parts in the assembly. When the substrate is fabricated from an organic material it is susceptible to thermal aging. Thus, heating the entire structure can affect the reliability performance of the resulting chip assembly.

The method and structure are now described in detail with accompanying figures. Like reference numerals refer to like elements across different embodiments. The figures are not to scale.

FIG. 1 describes an exemplary embodiment. FIG. 1 describes a gravity-assisted die removal apparatus (1) and process using inductive heating and a vacuum attached die removal head. An assembly to be reworked comprises a die (20) connected to the substrate (10) through a solder joint, for example via solder balls (30). An induction coil (40) is positioned over a die (20) to be removed. The induction coil is attached to an alternating current device (not shown) to form an induction heating system. A vacuum die removal head (50) is attached to a weight (60) via a die removal head neck (70). A vacuum tube (80) is connected to the die removal head neck (70) to provide a suction force to the vacuum die removal head (50) to make a vacuum-based connection between the die (20) to be removed and the vacuum die removal head (50). A vacuum source (not shown) is connected to the vacuum tube (80). In the rework process, the vacuum die removal head (50) is attached by a suction force created by the vacuum to the die (20) to be removed. The induction heating system is activated by sending an alternating electrical current through the induction coil (40) thereby producing a varying magnetic field which in turn induces an electric current in the solder balls (30) within the magnetic field. The resistance to electric current in the solder balls (30) causes them to heat and turn liquidus. Once the solder balls (30) have been melted, the weight (60) is pulled by gravitational force (90) to remove the die (20) from the substrate (10) while the die is still attached to the die removal head (50) by vacuum.

The gravity-assisted die removal apparatus of FIG. 1 performs the die removal/rework process while the assembly to be reworked is upside down to take advantage of the pulling force created by gravity upon the weight (60).

Figure 2:
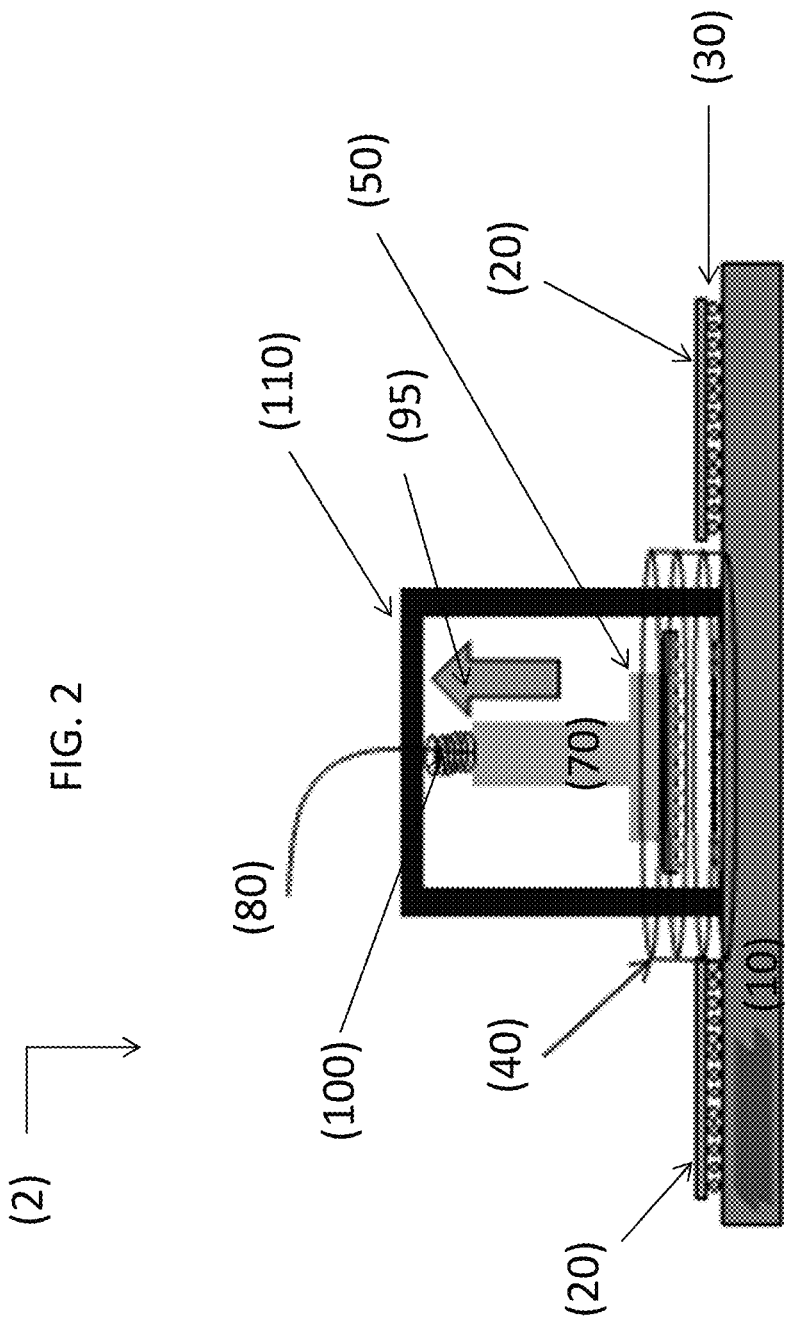
FIG. 2 illustrates a spring-assisted die removal apparatus and process using inductive heating and a vacuum attached die removal head.

FIG. 2 describes an alternative embodiment. FIG. 2 describes a spring-assisted die removal apparatus (2) and process using inductive heating and a vacuum attached die removal head. An assembly to be reworked comprises a die (20) connected to the substrate (10) through a solder joint, for example via solder balls (30). An induction coil (40) is positioned over a die (20) to be removed. The induction coil is attached to an alternating current device (not shown) to form an induction heating system. A vacuum die removal head (50) is attached to a spring (100) via a die removal head neck (70). The spring (100) in turn is connected to a spring apparatus housing (110). A vacuum tube (80) is connected to the die removal head neck (70) to provide a suction force to the vacuum die removal head (50) to make a vacuum-based connection between the die (20) to be removed and the vacuum die removal head (50). A vacuum source (not shown) is connected to the vacuum tube (80). In the rework process, the vacuum die removal head (50) is attached by a suction force created by the vacuum to the die (20) to be removed. The induction heating system is activated by sending an alternating electrical current through the induction coil (40) thereby producing a varying magnetic field which in turn induces an electric current in the solder balls (30) within the magnetic field. The resistance to electric current in the solder balls (30) causes them to heat and turn liquidus. Once the solder balls (30) have been melted, the spring (100) provides a mechanical force (95) to remove the die (20) from the substrate (10) while the die is still attached to the die removal head (50) by vacuum.

The gravity-assisted die removal apparatus of FIG. 2 performs the die removal/rework process while the assembly to be reworked is right side up as the spring provides the force to separate the die from the substrate. The spring can be fabricated from any suitable material including metal such as steel and stainless steel.

The vacuum die removal head can be fabricated from a soft, flexible, and thermally stable material to provide an adequate seal between the die surface and the vacuum die removal head. The soft, flexible, and thermally stable material can be a polymeric material such as an elastomer, for example an elastomer prepared from chloroprene, isoprene, isobutylene, styrene, 1,3-butadiene, or a copolymer thereof. Specific elastomers include polychloroprene (neoprene), styrene-butadiene rubber (SBR), silicone, and the like. "Thermally stable" means the material does have a change or structure or loss of strength at temperatures used to conduct the rework process.

The size of the vacuum die removal head can be smaller than the size of the surface area of the die to be removed, more specifically a size that allows for a good vacuum seal to be created between the vacuum die removal head and the die to be removed. In an embodiment, the size of the vacuum die removal head can be about 5 to about 99.5% of the surface area of the die to be removed, specifically about 50 to about 98%, and more specifically about 75 to about 95% of the surface area of the die. Exemplary vacuum die removal head sizes can be about 2 square millimeters (mm$^2$) to 25 mm$^2$, or larger.

The shape of the vacuum die removal head is not limited and can include circular, oval, square, rectangular, and the like shapes.

In alternative embodiments to those set out in FIG. 1 and FIG. 2, an adhesive die removal head can be used in place of the vacuum die removal head (50) and a post or another connecting means can be used in place of the die removal head neck (70).

Those skilled in the art will appreciate that the use of the vacuum die removal head, die removal head neck (70), vacuum tube (80), and vacuum source (not shown in the Figures) is a non-destructive process that allows for the removal of the die intact, thereby allowing for reuse an optional repair of the removed die. Such an approach is especially useful when the die itself is not defective, yet there is an interconnection defect between the substrate and die.

In general the induction heating system comprises an induction coil and an alternating electrical current power source electrically connected to the induction coil. When powered by the alternating electrical current, the induction coil produces a varying magnetic field. In turn, the magnetic field induces an electric current in an object when the object is placed within the magnetic field. The resistance to electric current in the object causes the object to generate localized heat. In the instant process, the die to be removed, along with the solder joint connecting the die to the substrate, are placed within the magnetic field generated by the induction coil. The solder joint is heated to a temperature sufficient to melt the solder. The temperature to melt the solder material can be, for example, about 180 to about 260° C.

The induction coil can be fabricated from an electrical conductor such as a metal, for example, aluminum, chromium, copper, gold, iron, nickel, or a combination thereof; or electrically conductive graphite.

The operating frequency of the induction heating system can be between about 1 KHz to about 400 KHz, more specifically about 10 KHz to about 100 KHz. The heating time may be within fractions of a second to several minutes.

The size of the induction coil can be about the same size as the die to be removed, or larger as needed. Advantageously, with an induction coil size about the size of the die, the amount of substrate exposed to heating is thereby limited. Further, the process allows for the rework of a single die with the advantage that the entire substrate is not exposed to heat, which occurs when a conventional rework oven is used.

In an embodiment, the induction coil has a size that can only accommodate a single die. In another embodiment, the induction coil has a size that can accommodate more than one die.

The use of the induction heating system allows for the process to be suitable for rework on a number of different structures, e.g., a single die on a single substrate; multiple dies one layer thick on a single substrate; and 3-D assemblies of stacked dies on a single substrate.

In an alternative embodiment, a spring-assisted die removal apparatus and process using a vacuum attached die removal head uses a heating source other than an induction heating system. Exemplary alternative heating sources includes a hot air gun, a hot air station, a reflow oven, and the like. The process and apparatus is similar to what is described for FIG. 2 except the induction coil (40) would be absent.

Figure 3:
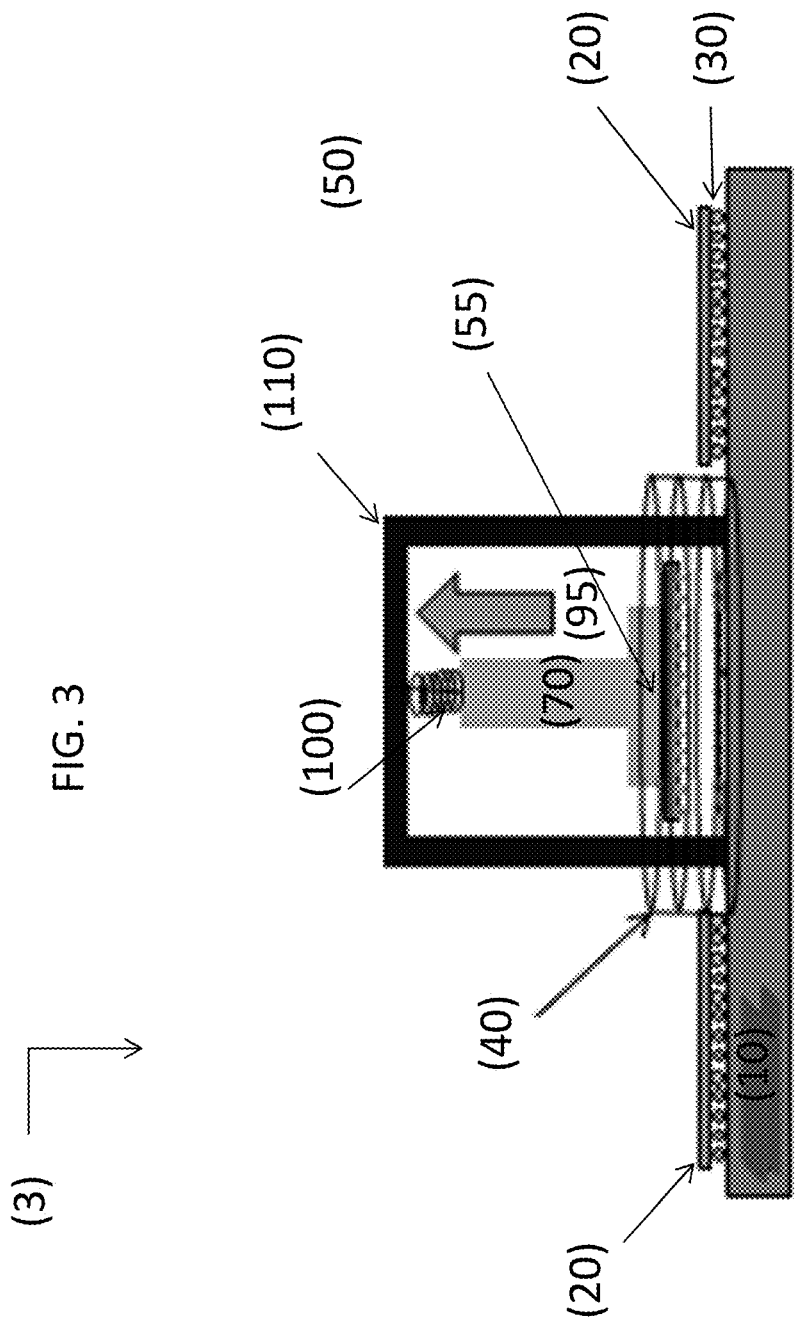
FIG. 3 illustrates a spring-assisted die removal apparatus and process using inductive heating and an adhesive-based die removal head.

In an alternate embodiment to the use of a vacuum die removal head (50), die removal head neck (70), vacuum tube (80), and vacuum source (not shown in Figures), an adhesive-based die removal head (55) can be used. FIG. 3 exemplifies a spring-assisted die removal apparatus (3) and process using inductive heating and an adhesive-based die removal head. Specifically, an assembly to be reworked comprises a die (20) connected to the substrate (10) through a solder joint, for example via solder balls (30). An induction coil (40) is positioned over a die (20) to be removed. An adhesive-based die removal head (55) is attached to a spring (100) via a die removal head neck (70). The adhesive (not shown) present on the die removal head is used to adhere a die (20) to be removed to the adhesive-based die removal head (55). The spring (100) in turn is connected to a spring apparatus housing (110). In the rework process, the adhesive-based die removal head (55) is attached to a die (20) to be removed by a mechanical connection created through the adhesive. The induction heating system is activated by sending an alternating electrical current through the induction coil (40) thereby producing a varying magnetic field which in turn induces an electric current in the solder balls (30) within the magnetic field. The resistance to electric current in the solder balls (30) causes them to heat and turn liquidus. Once the solder balls (30) have been melted, the spring (100) provides a mechanical force (95) to remove the die (20) from the substrate (10) while the die is still attached to the adhesive-based die removal head (55).

Likewise, another alternative embodiment is the use of an adhesive-based die removal head (55) in place of the vacuum die removal head (50) of FIG. 1. This embodiment is directed to a gravity-assisted die removal apparatus and process using inductive heating and an adhesive-based die removal head.

In yet another embodiment, a spring-assisted die removal apparatus and process using an adhesive-based die removal head is conducted using a heating source other than an induction heating system. Exemplary alternative heating sources includes a hot air gun, a hot air station, a reflow oven, and the like. The process and apparatus is similar to what is described for FIG. 3 except the induction coil (40) is absent.

In the embodiments where an adhesive is used to connect the die removal head to the die to be removed, the adhesive can be present on the die removal head itself, placed on the die to be removed prior to connecting to the die removal head, or a combination thereof.

Exemplary adhesives for use in the embodiments employing the adhesive-based die removal head can be synthetic adhesives which can form a bond either by a chemical reaction (e.g. crosslinking) or a mechanical bond formed by applying the adhesive in a melted state and allowing the adhesive to cool. Examples of suitable adhesives include adhesives based on acrylic/acrylate/arcrylonitrile and their methyl substituted analogs, epoxy-based adhesives, rubber cement, and other polymeric adhesives.

The rework apparatuses described herein may optionally further comprise one or more other features including, for example, a holding fixture, a thermocouple, a programmable controller, a sensor, a computer, and the like. The holding fixture can be a device to hold the assembly that needs rework. The thermocouple can be used to measure the temperature of the substrate being heated and to send a signal, indicative of the temperature of the substrate, to a programmable controller. In turn the programmable controller can compare the signal from the thermocouple to a predetermined voltage level corresponding to a melting temperature of the solder used in the assembly. When the temperature of the substrate reaches the melting temperature of the solder, the programmable controller can send one or more signals to a computer to initiate other steps in the die removal process.

The above processes and apparatuses are particularly suitable for the removal and rework of thin dies, i.e. dies having a thickness of 150 micrometers or less, from a substrate post chip join using a solder joint such as C4. However, the same processes and apparatuses can be used for removal and rework of dies having a thickness greater than 150 micrometers.

The types of dies are not limiting and can include any type known in the art to be joined by a solder joint such as in the form of a ball grid array (BGA), a column grid array (CGA), or a land grid array (LGA).

Non-limiting examples of suitable substrate materials include Si (silicon), strained Si, SiC (silicon carbide), Ge (geranium), SiGe (silicon germanium), SiGeC (silicon-germanium-carbon), Si alloys, Ge alloys, GaAs (gallium arsenide), InAs (indium arsenide), InP (indium phosphide), or any combination thereof.

Other examples of suitable substrates include silicon-on-insulator (SOI) substrates with buried oxide (BOX) layers. An SOI wafer includes a thin layer of a semiconducting material atop an insulating layer (i.e., an oxide layer) which is in turn disposed on a silicon substrate. The semiconducting material can include, but is not limited to, Si (silicon), strained Si, SiC (silicon carbide), Ge (geranium), SiGe (silicon germanium), SiGeC (silicon-germanium-carbon), Si alloys, Ge alloys, GaAs (gallium arsenide), InAs (indium arsenide), InP (indium phosphide), or any combination thereof.

Instead of the ceramic substrates described above, the substrate can be made from an organic material such as glass-reinforced epoxy resin laminate, polyimide, polyphenylene ether, polytetrafluoroethylene (PTFE), bismaleimide/triazine (BT) and epoxy resin, composite epoxy materials (CEM), and the like.

The processes described herein using induction heating and the corresponding apparatuses using an induction heating system are particularly suited for conducting rework on organic substrates, particularly those assemblies fabricated from organic substrates and high melting lead free solder alloys. The induction heating process can be selective and heat the solder joint of only those dies needing removal. The result is targeted, localized heating of the substrate, as opposed to overall heating of the substrate that occurs when a generalized heating source is used. The targeted heating limits the thermal aging of the organic substrate and other components of the assembly.

The thickness of the substrate is not intended to be limited.

The solder joints described herein may be in the form of a ball grid array (BGA) as shown in FIG. 1-3, a column grid array (CGA), or a land grid array (LGA). Suitable types of solder include Pb, eutectic Sn/Pb, near eutectic and eutectic lead free solder alloys (e.g., Sn/Ag, Sn/Ag/Cu, Sn/Cu), and the like. Exemplary solder material includes 63Sn/37Pb, 5Sn/95Pb, 52In/48Sn, 96.5Sn/3.5Ag, In one aspect, a method of conducting a rework process on a substrate comprising a die attached to the substrate through a solder joint involves connecting a vacuum die removal head to the die so that a vacuum connection is formed between the vacuum die removal head and the die; heating the solder joint to liquidus using inductive heating; and separating the die from the substrate. Further within this embodiment the vacuum die removal head is attached to a weight to provide gravity-assisted die removal. Further within these embodiments the die can have a thickness of 150 micrometers or less. Still further within these embodiments the substrate is an organic substrate.

In one aspect, a method of conducting a rework process on a substrate comprising a die attached to the substrate through a solder joint involves connecting a vacuum die removal head to the die so that a vacuum connection is formed between the vacuum die removal head and the die; heating the solder joint to liquidus using inductive heating; and separating the die from the substrate; within this embodiment the vacuum die removal head is attached to a spring to provide spring-assisted die removal. Further within this embodiment the die can have a thickness of 150 micrometers or less. Still further within these embodiments the substrate is an organic substrate.

In another aspect, a method of conducting a rework process on a substrate comprising a die attached to the substrate through a solder joint involves connecting a die removal head to the die using an adhesive so that a mechanical connection is formed between the die removal head and the die; heating the solder joint to liquidus using inductive heating; and separating the die from the substrate. Further within this embodiment the die removal head is attached to a weight to provide gravity-assisted die removal. Further within these embodiments the die can have a thickness of 150 micrometers or less. Still further within these embodiments the substrate is an organic substrate.

In still another aspect, a method of conducting a rework process on a substrate comprising a die attached to the substrate through a solder joint involves connecting a die removal head to the die using an adhesive so that a mechanical connection is formed between the die removal head and the die; heating the solder joint to liquidus using inductive heating; and separating the die from the substrate; within this embodiment the die removal head is attached to a spring to provide spring-assisted die removal. Further within this embodiment the die can have a thickness of 150 micrometers or less. Still further within these embodiments the substrate is an organic substrate.

In one aspect, a method of conducting a rework process on a substrate comprising a die attached to the substrate through a solder joint involves connecting a vacuum die removal head to the die so that a vacuum connection is formed between the vacuum die removal head and the die; heating the solder joint to liquidus; and separating the die from the substrate, wherein the vacuum die removal head is attached to a spring to provide spring-assisted die removal. Further within this embodiment the die can have a thickness of 150 micrometers or less. Still further within these embodiments the substrate is an organic substrate. Still further within these embodiments the heating is conducted using inductive heating.

In one aspect, a method of conducting a rework process on a substrate comprising a die attached to the substrate through a solder joint involves connecting a die removal head to the die using an adhesive so that a mechanical connection is formed between the die removal head and the die; heating the solder joint to liquidus; and separating the die from the substrate, wherein the die removal head is attached to a spring to provide spring-assisted die removal. Further within this embodiment the die can have a thickness of 150 micrometers or less. Still further within these embodiments the substrate is an organic substrate. Still further within these embodiments the heating is conducted using inductive heating.

After conducting the die removal/rework, further processing steps (not specifically shown in the Figures) on the resulting substrates and/or die can be performed. The further device processing steps can include replacement of the removed die with a new die, repair and reattachment of the removed die, and the like.

Those skilled in the art will appreciate that the exemplary reworked structures discussed above can be distributed in raw form or incorporated as parts of intermediate products or end products that benefit from having select dies removed and reworked.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   providing an assembly comprising a substrate and a die attached to the substrate through a solder joint, the die having a thickness of 150 micrometers or less;
   connecting a die removal head to the die, the die removal head comprising a connecting means to connect the die removal head to the die;
   heating the solder joint to liquidus using inductive heating; and
   separating the die from the substrate.

2. The method of claim 1, wherein the connecting means is a vacuum and the die removal head is a vacuum die removal head fabricated from a thermally stable elastomer.

3. The method of claim 1, wherein the connecting means is an adhesive located on the surface of the die removal head.

4. The method of claim 1, wherein the die removal head is attached to a weight to provide gravity-assisted die removal.

5. The method of claim 1, wherein the die removal head is attached to a spring to provide spring-assisted die removal.

6. The method of claim 2, wherein the die removal head is attached to a weight to provide gravity-assisted die removal.

7. The method of claim 2, wherein the die removal head is attached to a spring to provide spring-assisted die removal.

8. The method of claim 1, wherein the substrate is an organic substrate.

9. A method, comprising:
   providing an assembly comprising a substrate and a die attached to the substrate through a solder joint, the die having a thickness of 150 micrometers or less;
   connecting a die removal head to the die, the die removal head comprising a connecting means to connect the die removal head to the die;
   heating the solder joint to liquidus; and
   separating the die from the substrate,
   wherein the die removal head is attached to a spring to provide spring-assisted die removal.

10. The method of claim 9, wherein the heating is conducted using inductive heating.

11. The method of claim 9, wherein the connecting means is a vacuum and the die removal head is a vacuum die removal head fabricated from a thermally stable elastomer.

12. The method of claim 9, wherein the connecting means is an adhesive located on the surface of the die removal head.

13. The method of claim 9, wherein the substrate is an organic substrate.

* * * * *